United States Patent [19]
Alpert et al.

[11] Patent Number: 5,841,628
[45] Date of Patent: Nov. 24, 1998

[54] MINIATURE CIRCUIT CARD WITH RETRACTABLE CORD ASSEMBLY

[75] Inventors: Martin C. Alpert, Moreland Hills; Timothy R. Ponn, Mentor, both of Ohio

[73] Assignee: Click Technologies, Inc., Moreland Hills, Ohio

[21] Appl. No.: 903,129

[22] Filed: Jul. 30, 1997

Related U.S. Application Data

[63] Continuation of Ser. No. 719,329, Sep. 25, 1996, Pat. No. 5,655,143, which is a continuation of Ser. No. 231,203, Apr. 21, 1994, abandoned.

[51] Int. Cl.$^6$ .................................................. G06F 3/00
[52] U.S. Cl. .......................................... 361/600; 395/882
[58] Field of Search ............................... 395/800.01, 835, 395/282, 200.79, 833, 882, 892; 364/705.1, 712; 439/55, 76, 135; 361/600, 683, 686; 242/316, 375, 382, 385, 385.2

[56] References Cited

U.S. PATENT DOCUMENTS

| | | | |
|---|---|---|---|
| 3,630,466 | 12/1971 | Kindermann | 242/385.3 |
| 3,657,491 | 4/1972 | Ryder et al. | 191/12.2 R |
| 3,984,645 | 10/1976 | Kresch | 379/430 |
| 4,126,768 | 11/1978 | Grenzow | 379/357 |
| 4,575,621 | 3/1986 | Dreifus | 235/380 |
| 4,713,497 | 12/1987 | Smith | 191/12.2 R |
| 4,795,898 | 1/1989 | Bernstein et al. | 235/287 |
| 4,853,524 | 8/1989 | Yamaguchi et al. | 235/468 |
| 4,946,010 | 8/1990 | DiBono | 191/12.2 R |
| 5,094,396 | 3/1992 | Burke | 242/378.2 |
| 5,117,456 | 5/1992 | Aurness et al. | 379/438 |
| 5,183,404 | 2/1993 | Aldous et al. | 439/55 |
| 5,241,410 | 8/1993 | Streck et al. | 359/176 |
| 5,241,593 | 8/1993 | Wagner | 379/438 |
| 5,336,099 | 8/1994 | Aldous et al. | 439/131 |
| 5,338,210 | 8/1994 | Beckham et al. | 439/131 |
| 5,457,601 | 10/1995 | Georgopulos et al. | 361/686 |

FOREIGN PATENT DOCUMENTS

| | | |
|---|---|---|
| 471089 | 3/1992 | Japan . |
| 4216189 | 8/1992 | Japan . |
| 4313178 | 11/1992 | Japan . |

Primary Examiner—Alpesh M. Shah
Attorney, Agent, or Firm—Renner, Otto, Boisselle & Sklar

[57] ABSTRACT

A PCMCIA card includes a support, circuit components for providing faxmodem functions with respect to the support, a housing containing at least part of the support, a retractable cord mechanism at least partly contained in the housing for connecting the electronic component with an external device for communications therewith, the retractable cord mechanism including a cord and a storage mechanism for storing at least part of the cord in the housing, and a connector coupled to the cord for connecting to the external device. Alternate embodiments use optical or radio signal coupling from the PCMCIA card and all embodiments do not require a separate telephone connector to a telephone wall jack.

7 Claims, 7 Drawing Sheets

MINIATURE CIRCUIT CARD WITH RETRACTABLE CORD ASSEMBLY

This is a continuation of application Ser. No. 08/719,329, filed Sep. 25, 1996, which issued on Aug. 5, 1997, as U.S. Pat. No. 5,655,143, and which is a File Wrapper Continuation of application Ser. No. 08/231,203, filed Apr. 21, 1994, now abandoned.

TECHNICAL FIELD

The present invention relates generally, as is indicated, to miniature circuit cards and, more particularly, to miniature circuit cards having a retractable cord assembly. Additionally, the invention relates to PCMCIA cards or the like having a retractable cord assembly mounted thereon and/or at least partly therein.

BACKGROUND

In current computer technology a computer usually has electronic circuitry, memory, one or more processors, such as microprocessors, and long term storage medium, such as those known as a hard drive or some other type device. The computer is able to interface with a keyboard, a mouse, a track ball, a light stylus, etc., to receive input. The computer also may be interconnected with one or more other devices, such as peripheral equipment, other computers, telephone lines, etc. to receive and/or to output information, data, etc., as is well known. Usually a computer has a display on which information, data, images, etc. can be viewed by an observer, such as a person using the computer.

Historically various circuit cards have been connected in computers to add capabilities and/or to enhance capabilities. Exemplary circuit cards include video drivers, ports, memory, and others, as are well known. Many modern computers now also include a circuit card which has a modem capability and may also have a facsimile machine capability, such as those which are send only and those which are send and receive. One or more telephone connectors usually are mounted on such modem circuit cards and faxmodem circuit cards. An exemplary type connector is referred to as an RJ-11 connector or jack. Such RJ-11 jack usually is a female type, although the gender thereof is not critical.

To connect the faxmodem to a telephone system, such as that which terminates at a female RJ-11 jack wall connector or the like, a separate telephone cable is required. Such separate telephone cable usually includes a male RJ-11 connector at each end. The respective RJ-11 connectors can be plugged into their respective female RJ-11 jacks at the wall and at the faxmodem card. Unfortunately, sometimes a computer user may not have available a separate telephone cord to connect the faxmodem of the computer to a telephone system wall jack, for example. This problem is exacerbated when the computer is a portable type such as a laptop computer or a notebook computer; sometimes the telephone cord simply is left behind, forgotten, lost, and so on. Without such separate telephone cord, the faxmodem could not be used. Accordingly, it would be desirable to avoid such loss and/or to eliminate the need for such a separate telephone cord or other connector between a faxmodem card of a computer, especially a portable computer, and a telephone system.

In the past the faxmodem circuits of a computer have been able to receive incoming data, such as signals representing an incoming facsimile transmission, digital data other than facsimile format, and telephone messages, such as audio or voice type messages. The foregoing collectively may be referred to hereinafter as data, regardless of the type of data or information. Such data often is able to be stored for relatively long term storage in the hard drive or other storage medium of the computer and later can be read out, played out, transmitted out, etc. For example, a received facsimile message can be displayed on the computer monitor or printed. Digital data received can be displayed on the monitor, used to operate the computer, printed out, such as a word processed document, etc. Incoming voice messages can be digitized and stored for a subsequent playback through an appropriate amplifier and speaker system. For such purpose, a speaker jack or telephone jack which may have associated therewith amplifier equipment can be used to produce audio signals to be heard by the computer user. Usually, such audio function requires a separate amplifier system independent of the computer to receive signals from the computer and to amplify those signals to be played back by a speaker, headset, etc.

A fairly recent development in circuit card technology for use with computers, especially portable computers, and more especially relatively small size portable computers, such as laptop computers, notebook computers, personal digital assistant, etc., has been the miniature circuit card referred to as PCMCIA. The relatively small computers often do not have adequate space to include a faxmodem, for example. However, the faxmodem function and/or other functions can be provided by connecting a PCMCIA circuit card, other similar miniature circuit card, or the like, to the computer. Such PCMCIA cards usually have connectors thereon for plugging into or otherwise connecting to a PCMCIA connector slot that is built as part of the computer. When it is desired to provide the computer with faxmodem capability, a PCMCIA card having a faxmodem thereon can be plugged into such connector slot. Such a faxmodem PCMCIA card would have appropriate electronic components thereon for providing the faxmodem function in association with the power and control functions supplied by the interconnection with the computer. A separate telephone jack, such as an RJ-11 jack, may be attached to a portion of the PCMCIA card or may be built into the computer itself. A separate telephone cord is required to connect such jack to a telephone system or to some other piece of equipment to which the faxmodem is intended to be connected.

Conventional PCMCIA cards are miniature circuit cards which usually include a support, such as a printed circuit board, a multiple terminal connector at one edge of the printed circuit board, and a housing for enclosing at least part of the circuit board and electronic components (or other components) which are mounted thereon. The housing provides various protective functions, as is well known. The PCMCIA card connector is exposed at an end of the housing to provide the desired connection directly to the PCMCIA slot of the computer or such other device to which the PCMCIA card is to be connected. Sometimes space within the housing or cover of the PCMCIA card is expanded by using a stepped or non-planar housing shape.

BRIEF SUMMARY OF THE INVENTION

Briefly, according to the invention a telephone type or other type of connection is made from a circuit card, such as a miniature circuit card, without the need for a separate cable connector.

According to one embodiment, the aforesaid connection is made using a retractable cord assembly.

According to another embodiment the aforesaid connection is made using an optical coupling system.

According to still another embodiment, the aforesaid connection is made using a relatively low power radio transmission, for example, having the ability to transmit radio signals over a relatively limited range of, say, 30 feet plus or minus a few feet.

According to an aspect of the invention, a circuit card having electronic components thereon or at least having the ability to have circuit components mounted thereon also has directly associated therewith and mounted with respect thereto a retractable cord mechanism.

According to an aspect of the invention, a circuit card is connectable to an external device without the need for a separate telephone connector cord.

According to an aspect of the invention, a circuit card comprises a support for electronic components and a retractable cord mechanism mounted with respect to the support.

According to another aspect, a PCMCIA device includes a support, circuit components for providing modem functions with respect to the support, a housing containing at least part of the support, a retractable cord mechanism at least partly contained in the housing for connecting the electronic component with an external device for communications therewith, the retractable cord mechanism including a cord and a storage mechanism for storing at least part of the cord in the housing, and a connector coupled to the cord for connecting to such external device.

According to another aspect, a PCMCIA device includes a support, circuit components for providing modem functions mounted on or with respect to the support, a housing containing at least part of the support, an external communications device at least partly contained in the housing for connecting the electronic components with an external device for communications therewith, and an electrical connector for connecting circuit components with a PCMCIA connector of a computer or the like.

According to another aspect, an electronic apparatus includes a support for electronic components, the support including a circuit card-like device, and a cord storage mechanism mounted with respect to the support.

According to another aspect, a computer system includes a computer having circuitry and a storage medium, a connector slot for connecting the computer to an external circuit device, a circuit card-like device connectable to the connector slot, the circuit card-like device including a support, electronic components on the support, and an external communications device at least partly contained in the housing for connecting the electronic components with an external device for communications therewith.

According to the invention, a retractable cord is able to be used with a variety of computer and electronic devices. Examples include the PCMCIA card device described in detail herein. Examples also include connections being made to telephone jacks, to other types of electrical and/or electronic devices, such as other computers, network systems, control systems, radio systems, etc. In one embodiment the retractable cord is provided between a PCMCIA card and a telephone jack, such as those identified by the label RJ-11; but it will be appreciated that other types of connectors may be used. In an embodiment of the invention the PCMCIA card may be used for one or more purposes; examples of such purposes include as a modem, as a faxmodem, as a telephone answering machine type device, etc.

Examples of other uses of the retractable cord assembly of the invention include for various network type devices and networking cards and modems, such as those known as Ethernet, token ring, LAN, and others which currently exist and may exist in the future. Further, the invention is useful to provide retractable cord functions for modems, faxmodems, and the like, whether built into a computer, provided on a separate circuit card connected inside a computer case, as part of a PCMCIA card attachable to a computer, and free or stand alone modems, faxmodems, and the like. The retractable cord assembly also may be used both in portable computers and in nonportable computers. The retractable cord assembly may be used in conjunction with other types of devices used in the electronics field, such as microphones which are intended to be effectively built into a computer or other device, permitting such microphone to be withdrawn from the computer case and subsequently easily stored back in or at the case.

The foregoing and other objects, features, aspects and advantages of the present invention will become more apparent as the following description proceeds. It will be appreciated that while a preferred embodiment of the invention is described herein, the scope of the invention is to be determined by the claims and equivalents thereof.

To the accomplishment of the foregoing and related ends, the invention, then, comprises the features hereinafter fully described in the specification and particularly pointed out in the claims, the following description and the annexed drawings setting forth in detail certain illustrative embodiments of the invention, these being indicative, however, of but a few of the various ways in which the principles of the invention may be suitably employed.

DESCRIPTION

Figure 1:
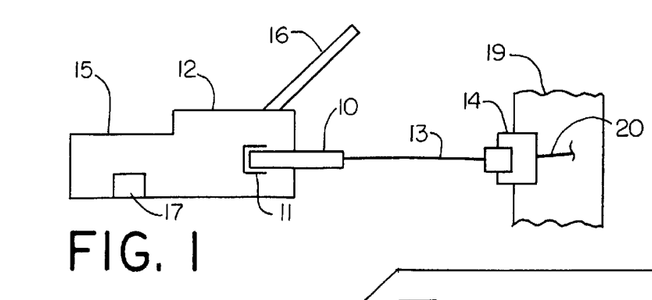
FIG. 1 is a schematic view of a computer system with a miniature PCMCIA card coupled to a wall jack telephone connector.

Referring, now, in detail to the drawings, wherein like reference numerals designate like parts in the several figures, and initially to FIG. 1, a PCMCIA card 10 is connected to a PCMCIA slot connector 11 of a computer 12. A cord 13 provides for connection between the PCMCIA card 10 and another connector 14, for example, to provide for electrical communications therebetween.

The computer 12 may be any type of computer, such as a desktop computer, portable computer, notebook computer, laptop computer, personal digital assistant (PDA), etc., which may be referred to collectively below as computer. For use with a PCMCIA card, the computer 12 preferably is a notebook or subnotebook, e.g., PDA, computer. The computer 12 may have a keyboard 15, display 16, and power supply 17, either of the battery type, connection to a utility company, etc., as is conventional. The PCMCIA socket connector 11 may be a standard type for connecting with a PCMCIA card.

The PCMCIA card 10 may be one having electronic components thereof which are able to provide facsimile functions and modem functions, often referred to as a faxmodem PCMCIA card. Such electronic components of the card are able to interact with software in the computer 12 to provide the desired faxmodem functions, as is known.

The cord 13 may be an electrical cord or cable having a pair of electrical conductors and insulation separating them, as is well know. The cord may be of appropriate size and strength characteristics able to provide not only the electrical functions described herein but also the storage and other use functions described. More or fewer conductors also may be included in the cable. Other types of cords also may be used. One example is an optical cable in which optical signals can be transmitted for connecting the circuit card 10 with the connector 14. For convenience and brevity of description hereinafter, the cord 13 is described as a two wire cable having a male RJ-11 telephone connector 18 at one end for connection to a female RJ-11 14 jack, which in turn is mounted in a wall of a building structure 19; and such jack 14 is electrically connected by appropriate telephone cables 20 to a telephone system (not shown). It will be appreciated, though, that other types of cables, connectors, and communications systems other than a telephone system also may be used and/or coupled to or associated with the PCMCIA card 10 and computer 12. One example is a direct connection to another computer; and another example is a direct connection to an electronic control system for lighting, machinery, etc.

Additionally, although the circuit card 10 is described hereinafter as a PCMCIA card, it will be appreciated that the circuit card 10 may be virtually any type of circuit card, although preferably a miniature type. Examples are those sold under the designation PCMCIA, PCMCIA-II, and so on. Further, although the PCMCIA card 10 is shown connected directly to a computer 12, it will be appreciated that the PCMCIA card 10 may be connected to other types of devices, connectors, supports, equipment, etc. as is known. One example is an adapter able to have several PCMCIA cards connected thereto, and in turn being connected to a further device, such as a computer or other apparatus. Other examples, such as lighting control systems, machinery control systems, etc. are mentioned above and otherwise would be obvious to a person having ordinary skill in the art.

Figure 2:
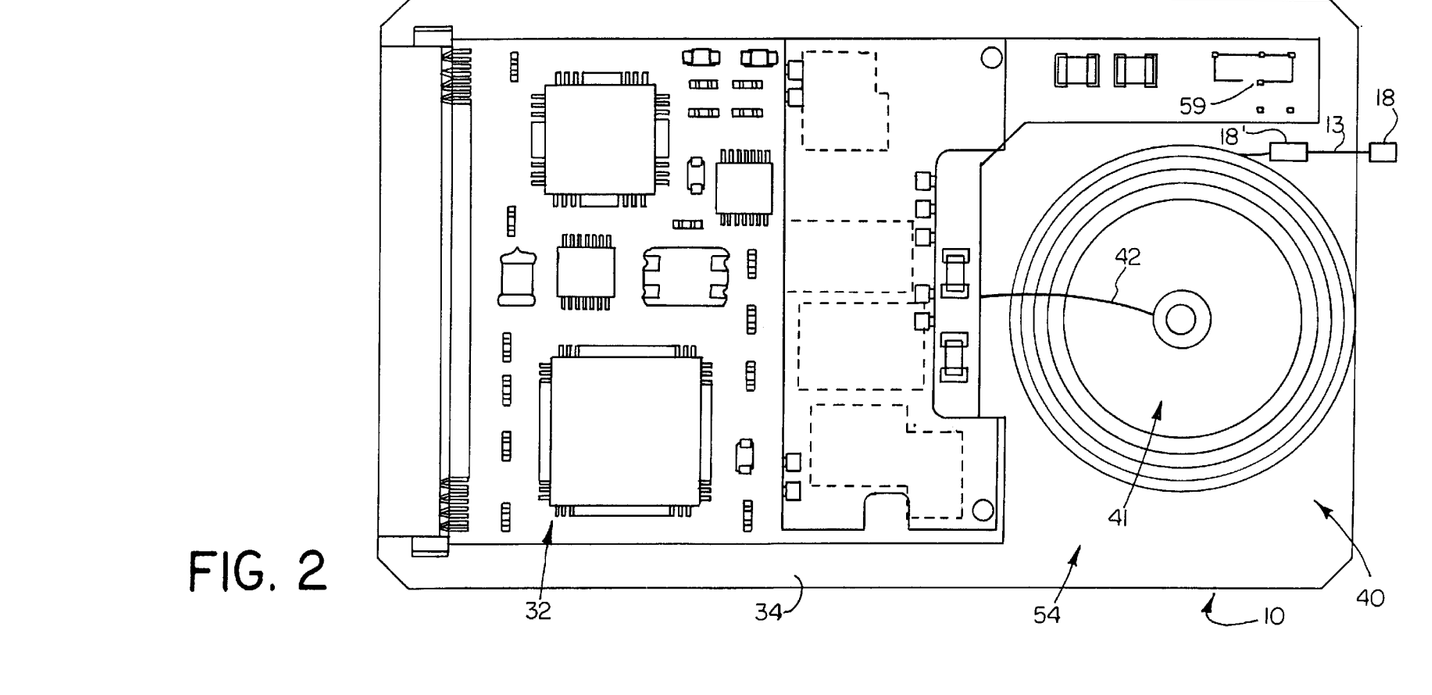
FIG. 2 is a top plan view of a miniature PCMCIA circuit card with a retractable cord assembly in accordance with one embodiment of the invention.
Figures 3, 4, 5, 6:
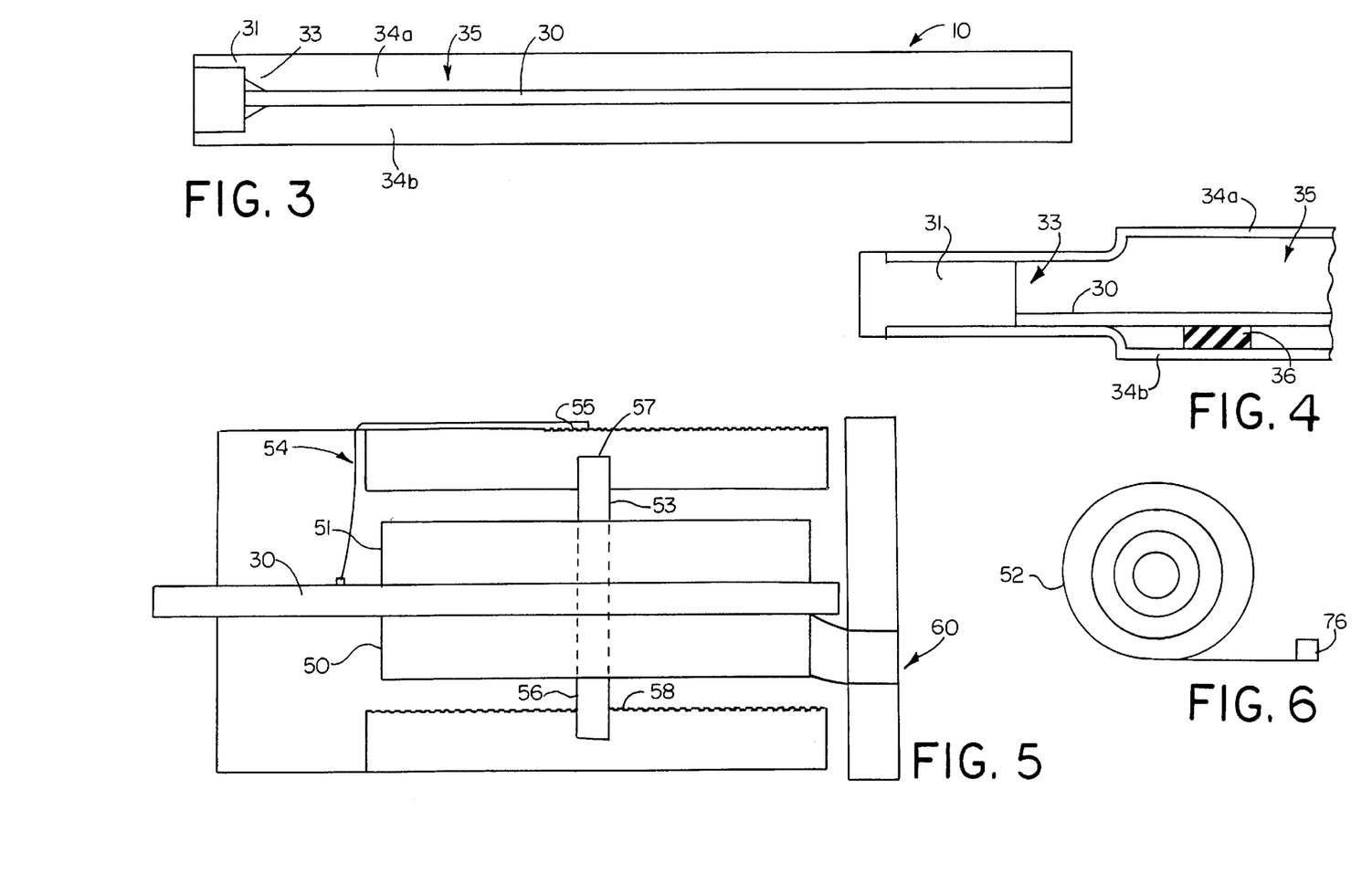
FIG. 3 is a side elevation view of the PCMCIA card of FIG. 2.
FIG. 4 is an enlarged fragmentary side elevation section view of the PCMCIA connector end of the PCMCIA card showing the printed circuit board supported within the housing of the PCMCIA card.
FIG. 5 is an enlarged side elevation view of the retractable cord assembly mounted in the PMCIA card housing.
FIG. 6 is a schematic illustration of the retracting spring of the retractable cord assembly of FIG. 5.

Referring the FIGS. 2, 3 and 4, the PCMCIA card 10 is shown in enlarged view. The PCMCIA 10 card includes a printed circuit board 30, for example, made of plastic, epoxy, or some other material which preferably is not electrically conductive. A plurality of printed circuit traces or other conductive means may be on the printed circuit board 30, in the board and/or through the board, as is well known. For simplicity of illustration, such printed circuit traces, conductive paths, etc. are not illustrated in the drawings.

As is seen at the left end relative to the illustration of FIGS. 2–4, an electrical connector 31 is provided to connect the PCMCIA card 10, and especially the circuitry on the printed circuit board 30, to a PCMCIA slot connector, such as that shown at 11 in FIG. 1. The electrical connector 31 preferably has a plurality of conductive terminals, leads, etc., thereby to provide a plurality of electrical interconnects simultaneously by such electrical connector, as is known. Mounted on the printed circuit board 30 are a plurality of electronic components, such as integrated circuits, resistors, capacitors, transistors, etc., all generally designated 32. Among those electronic components may be those which provide for the facsimile and modem functions of the PCMCIA card 10. Additionally or alternatively, the electronic components 32 may be those which provide memory functions for a computer, program functions and/or other functions. A connection generally designated 33 is provided between the electrical connector 31 and the electronic components 32 or the circuit paths on a printed circuit board 30 to which such components are connected thereby to provide interconnection thereof with the computer 12 or the like. The interconnects 13 may be electrical wires, spring clips, etc.

As is seen in FIGS. 2–4, the circuit card 10 includes a housing or cover 34 formed of respective upper and lower cover parts 34a, 34b, which are secured together with the printed circuit board 30 in the space 35 therein. The cover 34 preferably encloses most or all of the printed circuit board 30 in the space 35 to avoid dirt entry, to prevent the electronic components 32 from being manually touched causing grease or dirt to be applied to such components and/or to the leads thereof or to the printed circuit traces on the circuit board 30, and to prevent possible shock, short circuiting, etc. One or more mounting supports 36 may be provided to mount the printed circuit board 30 in the space 35, for example, by securing the mounting support 36 both to a surface of the printed circuit board and to a surface of one of the cover parts, such as that shown at 34b. Ordinarily the sole connection to such components 32 is via the electrical connector 31.

A retractable cord assembly 40 is mounted with respect to the printed circuit board 30 in the housing 34 of the PCMCIA circuit card 10. The retractable cord assembly 40 includes the cable 13, at least part of which is stored on a cord storage reel 41; electrical connection 42 to the conductors, circuit traces, electronic components 32, etc. of the PCMCIA card; and the connector 18. When the electronic components 32 of the PCMCIA card 10 providing faxmodem function, the cable 13 may be a telephone cable having two conductors and the connector 18 may be an RJ-11 connector intended to be plugged into an RJ-11 wall jack 14 or similar device. If desired, the connector 18 may be connected into an RJ-11 type jack in another computer or it may be connected to some other type of device. Also, the connector 18 may be other than an RJ-11 connector.

Via the connector 18, cable 13, and connection 42, the faxmodem provided by the electronic components 32 may be connected to a telephone system and via the electrical connector 31, the electronic components 32 may be connected to a computer to provide faxmodem function with respect thereto.

Preferably at least part of the retractable cord assembly 40 not only is mounted in but also is stored in the housing 34. Most preferably, substantially the entire cable 13 can be stored within the housing leaving exposed only the connector 18. The connector 18 may be pulled to withdraw cable 13 from the housing, extending such cable to connect with the RJ-11 jack 14, for example. Exemplary lengths of cable for such purpose may be from 7 feet to 9 feet or about from about 2 to about 4 meters. Such length, though, is not intended to be a limitation of the invention. If desired, part of the cable 13 may extend outside the housing and/or part of the reel 41 and/or other parts of the retractable cord assembly 40 may be mounted, supported or exposed outside the housing 34.

Turning to FIG. 5, the storage reel 41 of the retractable cord assembly 40 includes a cable storage reel 50 capable of neatly storing the cable 13 wound thereon; a spring storage reel or cartridge 51 within which a helical, circular, or other spring 52 (FIG. 6) can be neatly stored, and a mounting arbor 53. The cable storage reel 50 and spring storage cartridge 51 preferably are mounted on the arbor 53. The arbor 53 may pass through an opening (not shown) in the printed circuit card. Alternatively, the printed circuit card may be so designed as not to extend into the area 54 where the retractable cord assembly 40 is mounted in the housing 34 of the PCMCIA card 10. Slip rings or bushings 55, 56 mount the arbor 53 in openings 57, 58 in the respective cover parts 34a, 34b. Preferably the arbor 53 extends generally perpendicularly with respect to the major substantially planar extents of the cover parts 34a, 34b and the cable storage reel 50 and spring cartridge 51 are mounted so that as they rotate, such rotation is generally in parallel with the plane of the printed circuit board 30 without rubbing against the printed circuit board.

Referring to FIGS. 1 and 5, as the cable 13 is pulled out of the housing 34, the cable storage reel 50, spring cartridge 51, and arbor 53 rotate clockwise. During such rotation the spring 52 is tightened. As the cable 13 is drawn back into the housing 34, under the force influence of the spring 52, the arbor 53, cable storage reel 50 and spring cartridge 51 rotate counterclockwise.

As is seen in FIG. 2, a stereo jack 59 or equivalent connector for connection to a speaker system, amplifier system, headset, etc. is shown. Such jack 59 may be coupled directly to circuitry components 32 to provide audio output that can be heard by a user. As an example, such jack may be provided with voice messages stored digitally on the hard drive of the computer 12 and converted to audible signals for listening by a user.

Figures 7, 8, 9, 10, 11:
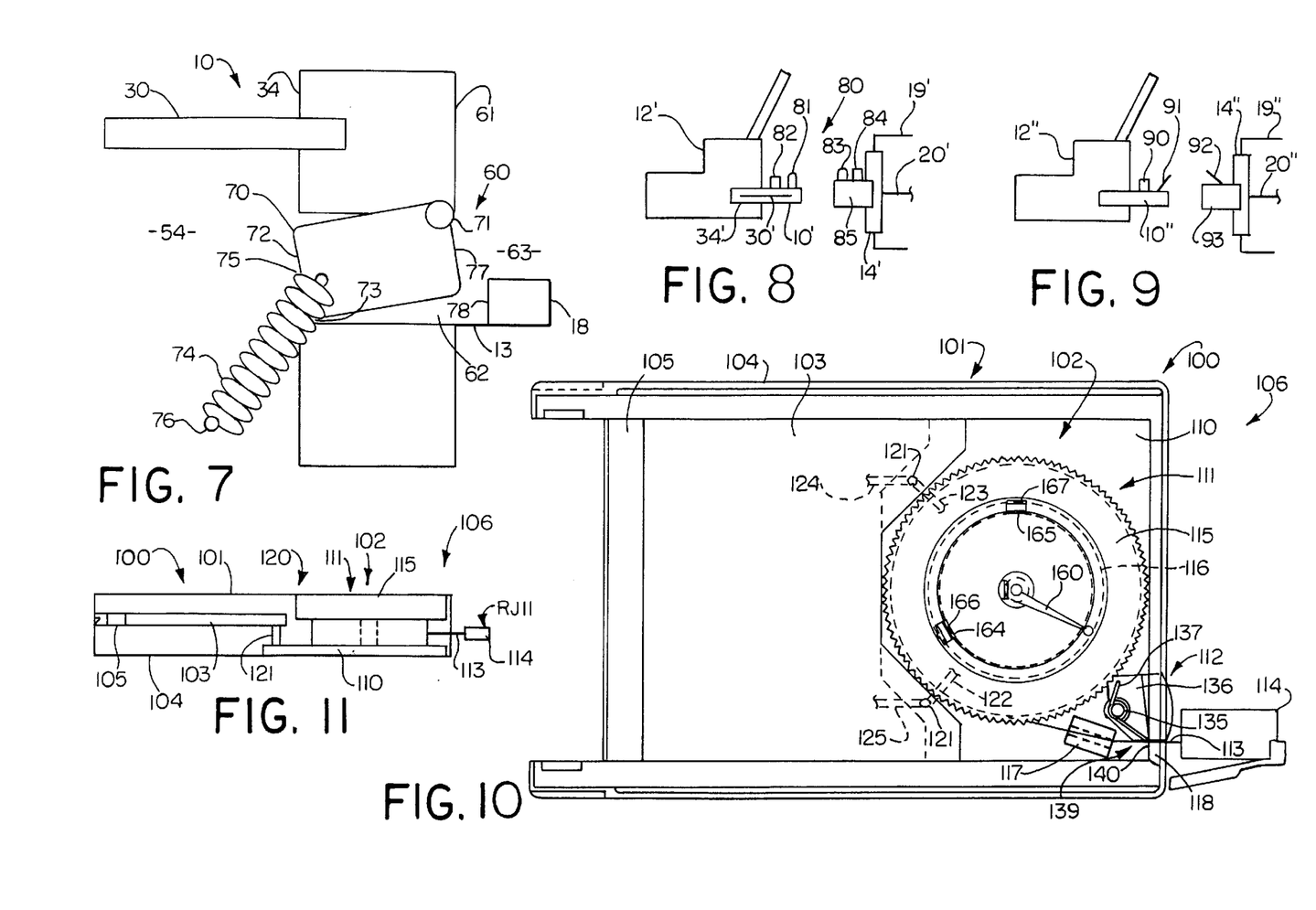
FIG. 7 is an enlarged schematic illustration of a brake mechanism for the cord of the retractable cord assembly.
FIG. 8 is schematic illustration of a computer with a PCMCIA card having an optical coupling to an optical receiver/transmitter.
FIG. 9 is schematic illustration of a computer with a PCMCIA card having an radio coupling to a radio receiver/transmitter.
FIG. 10 is a plan view of a PCMCIA card, from which part of one cover part has been removed, with a retractable cord assembly in accordance with another embodiment of the invention; and the following drawing figures concern portions of other embodiment.
FIG. 11 schematic side elevation view of the interior of the card.

Referring to FIG. 7, an enlarged view of the lower right portion of FIG. 5 is illustrated to show details of the brake 60. The brake 60 allows the cable 13 to be pulled from the cable storage reel 50 via a ferrite bead 50a, if desired, for noise suppression, filtering, and/or shielding purposes. The brake 60 also holds the cable in its extended or "pulled out" condition. The brake 60 can be released manually to enable the force of the spring 52 to re-wind the cable onto the cable storage reel 50, thereby pulling the cable back into the housing 34 and the RJ-11 connector 18 into close engagement or positioning relative to the back end 61 of the PCMCIA card 10. The PCMCIA card 60 includes an opening 62 in the back wall 61 thereof, and the cable 13 passes through the opening 62 from the inside area 54 of the PCMCIA card 10 to the exterior 63 where the connector 18 usually is stored.

The brake 60 includes a brake member 70 that is located in the opening 62 and is attached to the cover 34 by a pivot pin 71 or by some other mechanism to allow for pivoting movement of the member 70. The member 70 may be, for example, a generally rectangular piece of plastic, rubber or other material that provides desired coefficient of friction characteristics relevant to the cable 13 to hold the cable in a particular withdrawn position against the force of the spring 52 while permitting the cable 13 to be pulled by manually applied force, for example, out from the PCMCIA card 10. A location 73 on the brake member 70 is intended to engage the cable 13 in the manner just describe. More specifically, the location 73 on the brake member 70 is intended to provide sliding friction relative to the cable 13 with sufficient force to prevent the cable from being withdrawn into the housing 34 by the force exerted by the spring 52. However, such force applied by the brake member 70 to the cable 13 ordinarily will be insufficient to prevent the cable 13 from being withdrawn from the housing 34 of the PCMCIA card 10. A spring 74 pulls or biases the brake member 70 generally to the position illustrated in FIG. 7 to cause the location 73 of the brake member to engage the cable 13. The spring 74 is attached at 75, for example, by a pivot pin or by some other attachment mechanism to the brake member 70 and also at 76 to a point of attachment on the cover or on the cover 34 or printed circuit board 30.

The brake 60 works, as follows. The RJ-11 connector 18 and cable 13 can be pulled out from the PCMCIA card 10 by suitable manual force against the friction force applied by the brake member 70 which slides along the cable 13. When manual force is no longer being applied, the friction force applied by the location 73 of the brake member 70 against the cable 13 is sufficient ordinarily to prevent the cable from being withdrawn into the housing 34. However, when it is desired for the cable to be withdrawn into the housing for storage there, for example, manual force can be applied to the outside face 77 of the brake member 70 to pivot that member about the pivot point 71 releasing at least some, and preferably all, of the friction force applied by the location 73 to the cable 13. The force supplied by the spring 52, then, ordinarily is adequate to rewind the cable 13 on the cable storage reel 50. The force to pivot the brake member 70 may be applied by a finger of a person, by a separate instrument, by the back end 78 or the RJ-11 connector 18, or by some other means.

Turning briefly to FIGS. 8 and 9, alternate embodiments of the invention are illustrated. Like reference numerals designate like parts, as was mentioned above. However, the corresponding or like reference numerals are designated by a prime in FIG. 8 and by a double prime in FIG. 9.

As is seen in FIG. 8, the PCMCIA card 10' is connected to the computer 12' as aforesaid. However, rather than a separate cable being provided to interconnect the PCMCIA card 10' with an RJ-11 jack 14 at the wall 19, an optical coupling 80 is used. The optical coupling 80 includes a light source 81 and a light detector 82 mounted on, in, or otherwise exposed relative to the PCMCIA card housing 34' and circuit board 30'. At the RJ-11 connector 14' at the wall 19', there is a light source 83 and light detector 84, as well as circuitry 85. The circuitry 85 converts the signals received from the telephone system wires 20' to optical signals for transmitting to the detector 82 at the PCMCIA card at 10'. The detector 82 converts the received optical signals, such as infrared signals, to electrical signals which can be used by the electronic components on the printed circuit board 30' of the PCMCIA card 10'.

To send optical signals from the PCMCIA card 10' to the detector 84 at the wall 19' (or at some other device to which the computer 12 is intended to be connected via the PCMCIA card 10', the source 81 receives electrical signals from the electronic components on the circuit board 30' of the PCMCIA card 10' and converts those signals to light signals, such as infrared light or other electromagnetic energy, wavelength, etc.; and those light signals are directed to the detector 83. The detector 83 and, if required, circuitry 85 convert such received light signals to appropriate electrical signals for transmission to the telephone wire system 20'.

In FIG. 9 the PCMCIA card 10" includes a low power radio, such as a low power FM radio of conventional design generally designated 90. The radio 90 includes an antenna 91 for sending or receiving signals relative to an antenna 92 and associated FM radio circuity 93 located at the RJ-11 wall jack 14" in the wall 19". As was described above with respect to FIG. 8, the respective radios 90, 93 and antennas 91, 92 may be used to provide for interconnection between the computer 12" and the telephone cable and system designated 20".

In the embodiment described above with respect to FIGS. 1–7, there is no need for special optical transmitter and receiver device 83, 84, 85 to be connected to the RJ-11 wall jack 14' or for a line of sight optical coupling. There also is no need for radio signal transmission. The embodiment illustrated in FIG. 8 does not require radio signal transmission. The embodiment illustrated in FIG. 9 does not require line sight transmission. None of the embodiments requires a separate telephone cable.

An alternate embodiment 100 of miniature circuit card 101 such as a PCMCIA card with a retractable cord assembly 102 is shown in FIG. 10 and is described below with reference to FIGS. 10–32. The circuit card 101 is a PCMCIA card; however, it may be another type of circuit card, housing or support, or other device with which the cord assembly 102 is employed. The PCMCIA card 101 includes a printed circuit board 103 or the like on which electrical and/or electronic components may be mounted in usual manner, as is conventional in PCMCIA cards. The PCMCIA card also includes a cover or housing 104, but only the bottom portion is shown, whereas the top portion has been removed or in any event is not illustrated in the drawing of FIG. 10 in order to show the retractable cord assembly 102. At one end of the circuit board 103 is a conventional electrical connector 105, such as that shown at 31 in FIG. 4. At the back end 106 of the PCMCIA card 101 is the retractable cord assembly 102.

The retractable cord assembly 102 includes a circuit board support device 1 10, a spool assembly 111, a lock assembly 112, the cord 113, and a connector or cable termination 114. In the illustration the cable termination 114 is a male RJ-11 connector; however, it will be appreciated that other types of connectors or other devices may be used as the cable termination. As was mentioned above, for example, the cable termination may be a microphone or some other device; another example is an optical sensor, a temperature sensor, or some other sensor or detector device. Further, the cable termination may be a device which produces a particular output, such as an optical output, a laser, a temperature output, and so on. The number of conductors in the cord, which sometimes referred to as a cable or as an electrical cable, may be a function of the type of duty the cord is to serve; such as a telephone connection device in which case two conductors typically would be used; but more or fewer conductors may be used, as will be appreciated. An exemplary cord is sold under the designation "flex cable", which has good flexibility characteristics and strength and integrity characteristics, too, so the cable in ordinary use will not break.

As is seen in FIG. 10, the cord 113 is wrapped on the spool 115 around a ring 116, which are part of the spool assembly 111. The cord 113 exits the housing 104 through a ferrite bead 117, which may or may not be required, depending on filtering or shielding requirements, through the lock assembly 112, and through an opening 118 in the housing 104. When the cord 113 is substantially fully stored in the housing 104, it is substantially fully wrapped around the ring 116; when the cord is withdrawn from the housing 104, it is pulled, for example, at the connector 114, and causes the spool 115 to rotate as the cord is pulled from the ring, through the ferrite bead 117 and out past the lock assembly 112. The cord is attached to the spool 115 at or near the end of the cord remote from the connector 114; and, therefore, the cord ordinarily is not fully separated from the PCMCIA card 101. When it is desired to withdraw the cord 113 back into the PCMCIA card 101 for storage, the cord is re-wound on the ring 116 of the spool 115, as is described further below.

Briefly referring to FIG. 11, the arrangement of circuit boards 103, 110 and spool assembly 111 in the housing 104 is shown in elevation. The circuit boards 103, 115 are in spaced apart planar relation and overlapping, as at 120 to permit interconnection thereof by electrically conductive pins 121, a jumper or some other means. On the circuit boards are respective electrically conductive traces 122–125, for example two traces on each board, which represent electrically connections with respect to the to conductors of the cord 113. Each of those two traces (or more if more are required) on one board is connected to a respective trace on the other board via a respective pin connector 120. The pin connectors may be soldered to plated through holes or the like in each of the circuit boards. In this way, connection between the circuitry on the circuit board 103 and the cord conductors can be made.

Figures 12, 13, 14, 15, 16, 17, 18, 19, 20, 21, 22, 23, 24:
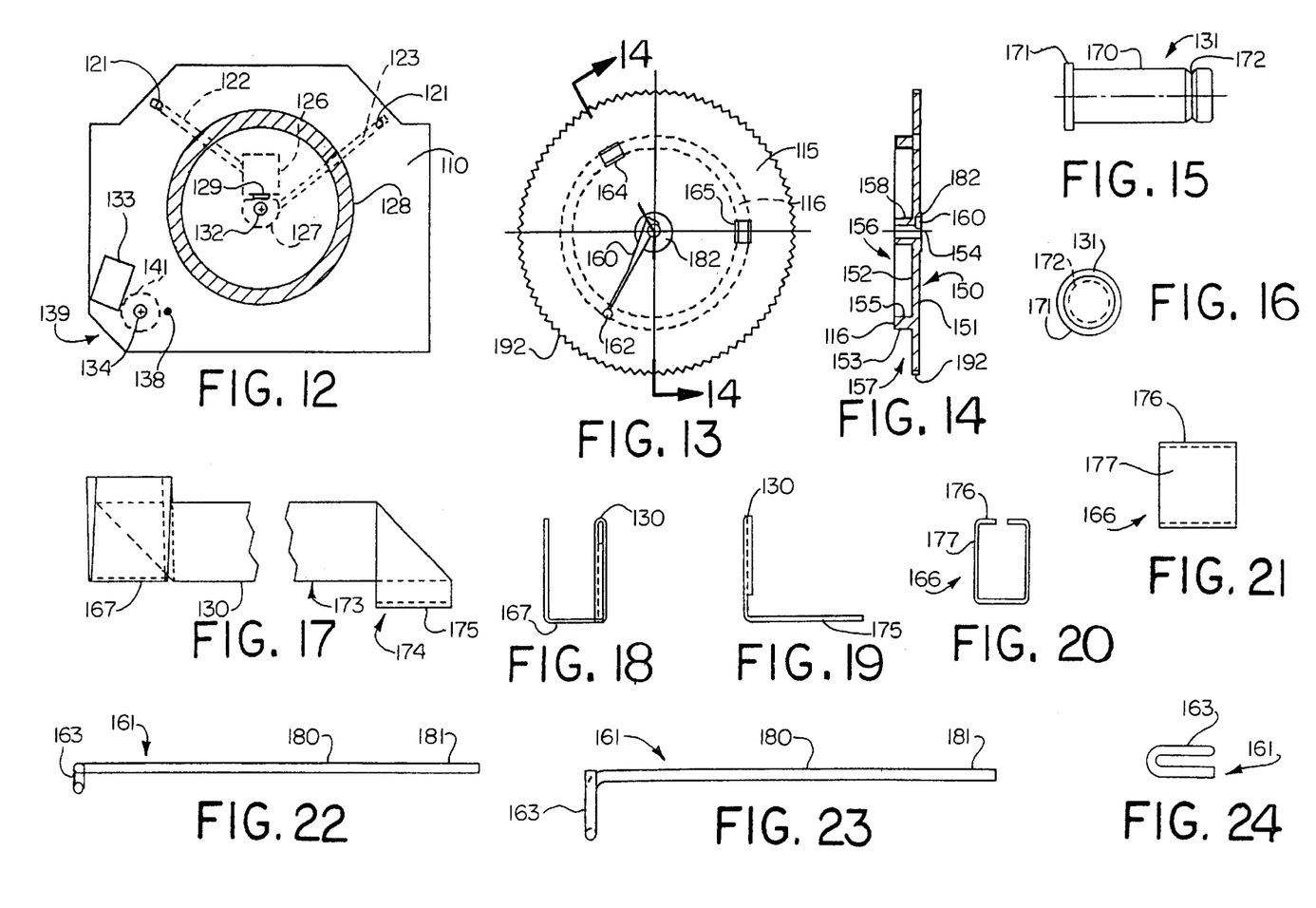
FIG. 12 is a top plan view of a retractable cord assembly circuit board.
FIG. 13 is a top plan view of the spool of the retractable cord assembly.
FIG. 14 is a side elevation section view of the spool of FIG. 13 looking generally in the direction of the arrows 14—14 of FIG. 13.
FIG. 15 is a side view of a pivot pin used for mounting the spool and for mounting the pawl of the retractable cord assembly of FIG. 10.
FIG. 16 is an end view of the pivot pin.
FIGS. 17–19 are, respectively, side, left end, and right end views of the power spring for the spool of the retractable cord assembly of FIG. 10.
FIGS. 20–21 are, respectively, end and side views of a strain relief clip.
FIGS. 22–24 are, respectively, top, side and end views of a wiper terminal.

As is seen in FIG. 12 circuit traces 122, 123 on circuit board 110 are connected to respective conductive connector pins 121 which in turn are connected to respective circuit traces 124, 125 on circuit board 103 (shown in FIG. 10). The circuit traces 122, 123 are coupled to respective terminal pads 126, 127 located on the bottom of the circuit board 1 10 relative to the illustration of FIGS. 10–12. The terminal pads 126, 127 in turn are coupled electrically to respective conductors of the cord 113, as is described further below. A circular electrically conductive trace 128 is provided on the top surface of the circuit board 110 for possible connection to another conductor, to a wiper terminal, or to some other electrical member, as may be needed. Other conductive traces also may be included on or in the circuit board 110 for various purposes, as may be desired.

The circuit board 110 also includes a slot 129 therethrough to permit insertion of an electrically conductive terminal portion of the power spring 130 (FIGS. 10 and 17–19) or torsion spring for the spool 115 to pass therethrough and to be located in engagement with the terminal pad 126 for electrical connection thereto. The terminal pad 127 is electrically isolated from the terminal pad 126 and the indicated terminal portion of the power spring. However, the terminal pad 127 is coupled electrically to an electrically conductive pivot pin 131 (FIGS. 15–16) by which the spool 115 is mounted to the circuit board 110 through an opening 132.

As is seen in FIG. 12, the circuit board 110 may include an opening 133 to retain the ferrite bead 117. The circuit board 110 also includes an opening 134 to receive a further pivot pin 135 associated with the pawl 136 of the lock assembly 112 (FIGS. 1, 27 and 28) for mounting the pawl 136 to the circuit board 110 and to provide a pivot point for the pawl and the pawl spring 137 (FIGS. 10, and 29–31). A small opening 138 through the circuit board 110 provides one anchor or point of fixation for the pawl spring 137. A cut out area 139, such as the triangular shape cut out shown in FIGS. 10 and 12, is provided in the circuit board 110 to provide space for movement of the pawl spring cord hook 140, which is described in further detail below. A conductive trace 141 may be provided at and/or about the opening 134 in the circuit board 110 for mechanical connection of and electrical connection to the pivot pin 135, if desired, for example, if it were desired to use the pivot pin 135 to make electrical connection to another member.

Turning to FIGS. 13 and 14, the spool 115 is shown in detail. The spool includes a main spool circular section 150 having a top surface 151 and a bottom surface 152. (It is noted here that references to top and bottom, left and right, interior and exterior, or other directions, are generally with respect to the illustrations in the drawings. However, such reference to direction only is for convenience and the various parts may be at other directional locations relative to other parts.) The ring 116 is an annular circular ring or step which depends from the bottom of the section 150. The ring 116 has an exterior surface 153 relative to the central axis 154 of the spool, onto which the cord 113 may be wound. The ring 116 also has an interior surface 155 relative to the axis 154 against which part of the power spring 130 may be engaged. The ring 116 bounds an area 156 below the bottom surface 152 of the spool where the power spring is intended to be located; and the ring exterior surface also cooperates with the bottom surface of the spool radially beyond the ring to form an area 157 where the cord 113 is stored.

Figure 25:
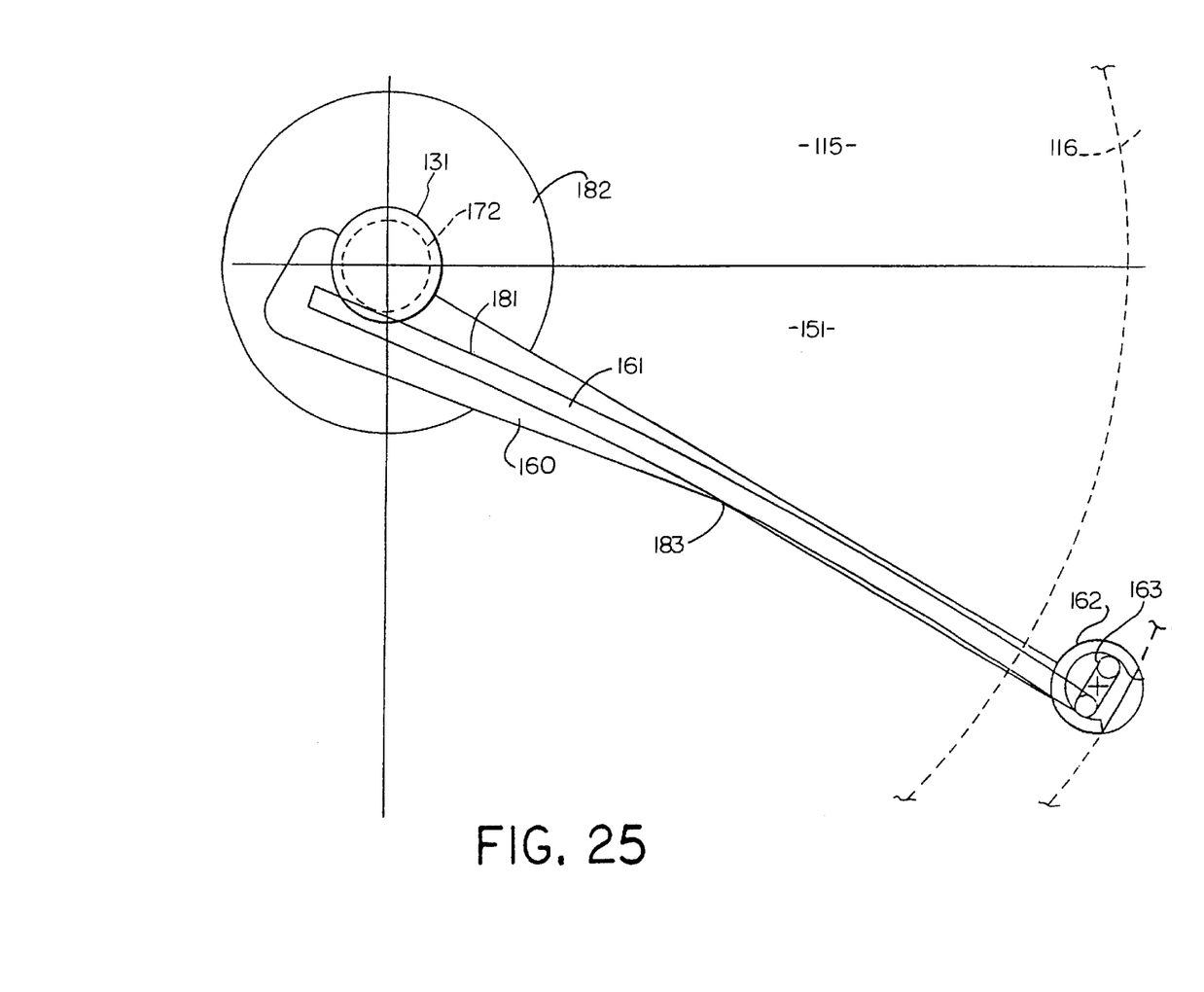
FIG. 25 is an enlarged top view of the wiper terminal positioned with respect to and in a channel of the spool, one conductor of the cord, and pivot pin.

A hollow cylindrical annular hub 158 circumscribes the axis 154 of the spool 115, bounds the area 156, and provides for support of the spool from the pivot pin 131, which is located in the hollow interior of the hub. A groove or channel 160 in the top surface 151 of the spool 115 receives therein a wiper terminal 161 (FIGS. 22–25). An opening 162 through the main section 150 of the spool 115 provides a space to locate a wire connecting support arm 163 of the wiper terminal 161 for supporting and positioning the wiper terminal and for making connection between the wiper terminal and one of the cord conductors. As is seen in FIGS. 13 and 25, such opening 162 extends through not only the main section 150 of the spool 115 but also through part of the ring 116, which increases the strength of support and connection for the wire connecting support arm 163 and cord conductor and also reduces the possibility of creep or like damage to the plastic material of which the spool may be made.

As is seen in FIGS. 13 and 14, two windows 164, 165 are provided through the main section 150 of the spool 115, each having a portion which overlaps the ring 116. The windows 164, 165 provide a space for clips 166, 167 (FIGS. 10, 17–18 and 20–21) to clip about the ring onto the spool 115 do retain the cord to the ring. The clip 166 (FIGS. 10, 20, 21) is a strain relief clip which holds the cord to the ring 116. The clip 167 is part of the power spring 130 and is intended not only to hold one of the conductors of the cord to the spool but also to make electrical connection with that conductor and to provide a conductive path through the power spring to the terminal pad 126 (FIG. 12). The top of each window 164, 165 preferably is recessed below the top surface 151 of the main section 150 of the spool so that the respective clips do not protrude above such surface 151 so as to help to maintain the surface smooth and to minimize the height profile of the spool assembly 111 and the overall cord assembly 102.

The pivot pin 131, which is seen in detail in FIGS. 15 and 16, is an electrically conductive pin. It has an elongate cylindrical shaft 170, which extends through the opening 132 of the circuit board 110 and through the hub 158. A flange 171 at the bottom of the pivot pin 131 prevents the pin from being pulled up and out through the circuit board 110. A groove, channel, or like recess 172 in the surface of the pivot pin 131 near the top receives the terminal wiper 161, as is seen in FIG. 25, for example. The flange 171 is engaged with the terminal pad 127 and preferably is soldered thereto or is attached thereto by conductive epoxy or in some other manner which provides electrical connection between the pivot pin 131 and the terminal pad and also may prevent the pivot pin from falling out from the circuit board 110. The pivot pin 131, therefore, provides electrical connection between the wiper terminal 161 and the terminal pad 127.

Referring to FIGS. 17–19, the power spring 130 is shown in detail. The power spring 130 may be made of 301 stainless steel or some other appropriately strong, yet resilient, and preferably non-corrodible material with suitable characteristics to apply rotational force to the spool 115 and electrical connection between one of the cord conductors and the terminal pad 126. In the illustrated embodiment, the power spring 130 is from about 60 inches to about 70 inches in length; and it is of a width suitably matched to the height of the spool ring 116 as to be fully retained within the area 156 without binding against the circuit board 110. The power spring 130 may be wound in a generally helical fashion or in some other suitable fashion. At the outer end of the helically wound spring is the spring clip 167, which is formed by folding the outer end of the spring generally in the manner shown in FIGS. 17 and 18. The spring clip 167 is so folded as to have a height greater than the width of the wound portion 173 of the power spring 130 so as to extend into the window 165 of the spool on opposite sides of the ring 116 and to be trapped by walls of the main section 150 and/or ring 116. Therefore, the spring clip 167 will tend not to move circumferentially along the ring 116. This feature of the spring clip is also designed so that as the spring is wound tightly at the center, the combined tangential and normal forces do not result in the spring deforming and pulling off the ring 116 towards the central axis 154 of the spool.

The spring clip 167 us used to clamp one of the cord 113 conductors either within the folds thereof, between the clip and the ring 116, or in some other way. Conductive epoxy, soldering, or some other technique may be used further to secure the conductor to the spring clip 167 and/or to enhance the electrical connection between the power spring and the conductor.

At the inner end 174 of the helically wound power spring 130 is another folded section which forms a flat terminal connector surface or tail 175, which is seen at the right-hand section of FIG. 17 and in FIG. 19. The folded arrangement in the power spring 130 inner end 174 provides the connector tail 175 and support thereof below the major planar extent of the wound portion 173 of the power spring to assure that the connector tail can fit through the slot 129 in the circuit board 110 and be suitably positioned in engage with the terminal pad 126. The connector tail 175 preferably is soldered to or attached by conductive epoxy or some other means to the terminal pad 126 for secure mechanical and electrical connection thereto. This mechanical connection holds the inner end 174 of the power spring 130 in fixed location relative to the circuit board 110 with the connector tail 175 positioned through the slot 129. Therefore, the inner end 174 of the power spring will not move as the spool rotates about the pivot pin 131. Further, through the connection between the outer end 167 of the power spring 130 to the cord conductor, the electrically conductive character of the power spring, and the connection of the power spring to the terminal pad 126, electrical connection can be made via the circuit trace 123, connector pin 121 and circuit trace 124 on circuit board 103 to the other circuitry on that circuit board.

Briefly referring to FIGS. 20 and 21, the strain relief clip 166 is shown. The strain relief claim 166 may be metal or some other material which has suitable flexibility to slip over the ring 116 to position the holding tabs 176 at the ends of the legs 177 thereof in the recessed window 164 of the spool. The strain relief clip holds the cord between one of the legs of the clip and the outer surface 153 of the ring 116. Other types of strain relief clips also may be used according to the invention. It will be appreciated that the strain relief clip 166 preferably holds both conductors of the cord, preferably the entire cord, in engagement with the ring so that the cord will not be pulled free of the connections respectively to the wiper terminal 161 and the spring clip 167. The strain relief clip 166 tends to prevent stress from being applied to those conductor connections.

In FIGS. 22–24 the wiper terminal 161 is shown in detail. The wiper terminal includes the wire connecting support arm 163, which is intended to be connected directly to a conductor of the cord, and an elongate, resilient arm 180. The wiper terminal 161 preferably is electrically conductive. The remote end 181 of the arm 180 relative to the wire connecting support arm 163 is intended to engage the pivot pin 131 at the groove 172 thereof and to tend to be resiliently urged into that groove to be retained therein under usual circumstances of use. The retaining of the wiper terminal 161 in the groove 172 of the pivot pin ends to hold the spool on the pivot pin 131.

Referring to FIG. 25, the positioning of the wiper terminal 161 relative to the spool 115, pivot pin 131, and opening 162 in the spool is seen. FIG. 25 is a fragmentary enlarged view of the spool looking down on the top surface 151. The channel 160 is recessed in the top surface 151 and extends from the opening 162 to an area where the pivot pin 131 is located at the center of the spool 115. The channel 160 is sufficiently deep, e.g., about 0.020 inch, that the wiper terminal 161 does not extend above the plane of the top surface 151 of the spool 115. At the center of the spool 115 surrounding the pivot pin 131, except where the channel 160 is cut, is a raised land 182 which serves as a thrust bearing for the spool. Such thrust bearing can bear against the inside surface of the PCMCIA card case in case there is some movement of the spool toward that surface. The thrust bearing tends to prevent the other portions of the spool from engaging such surface of the case, and the size of the thrust bearing preferably is relatively small to minimize friction that would resist rotation of the spool.

The wire connecting support arm 163 of the wiper terminal 161 fits into the opening 162 of the spool 115. Into that opening 162 also is placed part of the insulation and a conductor of the cord 113. Preferably the remaining space in the opening 162 is filled with conductive epoxy. Such conductive epoxy not only mechanically holds the parts together in the opening 162 but also electrically connects the conductor and the wiper terminal. Further, the conductive epoxy preferably fills the space in the opening 162 and, therefore, tends to prevent creep, which sometimes can happen to plastic under load conditions, in the plastic or other material of which the spool is made in the area of the opening 162. Preventing creep and also mechanically and electrically connecting the conductor and the wire connecting support arm 163 tends to maintain the integrity of the electrical and mechanical connection of the arm 163 and conductor. Further, as is described just below, such conductive epoxy helps to assure that the support arm 163 is retained securely in the opening 162 as the wiper arm 180 is resiliently flexed.

As is seen in FIG. 25, the wiper terminal 161 is part of a stable three point system. Specifically, the end having the support arm 163 is securely retained in the opening 162. The remote connecting end 181 which fits in the groove 172 and is in relatively secure or strong wiping engagement with the pivot pin. A support 183, such as the illustrated support point, applies force to the wiper arm 180 of the wiper terminal 161 urging the remote connecting end 181 securely against the pivot pin 131. By moving the support force applying point 183 to a location along the length of the wiper arm 180, the wiper arm tends not to be overstressed beyond its elastic limit, but it nevertheless is able to engage the pivot pin securely without putting additional stress or twisting moment on the support arm 163 that might tend to loosen the connection of the latter at the opening 162.

In FIGS. 26–31 details of the locking assembly 112 including the pawl 136 and pawl spring 137 are illustrated. The pawl 136 preferably is a single piece molded plastic body 190 which has teeth 191 at one part, such as the illustrated corner, thereof. Such pawl teeth 191 are intended to correspond generally with the teeth 192 which circumscribe the outer perimeter of the spool. A serrated edge 193 of the pawl body 190 is accessible at and possibly is exposed in the opening 118 of the cover 104 and is able to be manually addressed to move the pawl to a desired orientation locking or unlocking the spool 115, as may be desired. A pawl spring 137 ordinarily urges the pawl 136 to an orientation rotated in a counterclockwise direction as viewed in FIG. 26, for example, to cause the teeth 191, 192 to mesh to lock the spool 115 from rotating. The pawl also can be rotated in the indicated counterclockwise direction by manual force applied to the serrated edge 193.

Figure 26A:
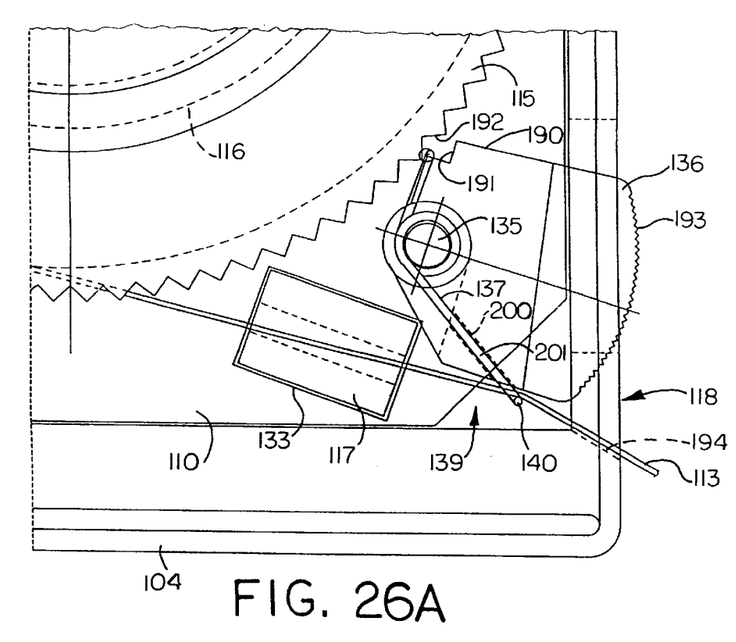
FIGS. 26A and 26B are enlarged plan views of the pawl locking mechanism of the retractable cord assembly positioned relative to the spool, cord, spool, and pcmcia housing, the pawl being shown in unlocked mode and locked mode, respectively.
Figure 26B:
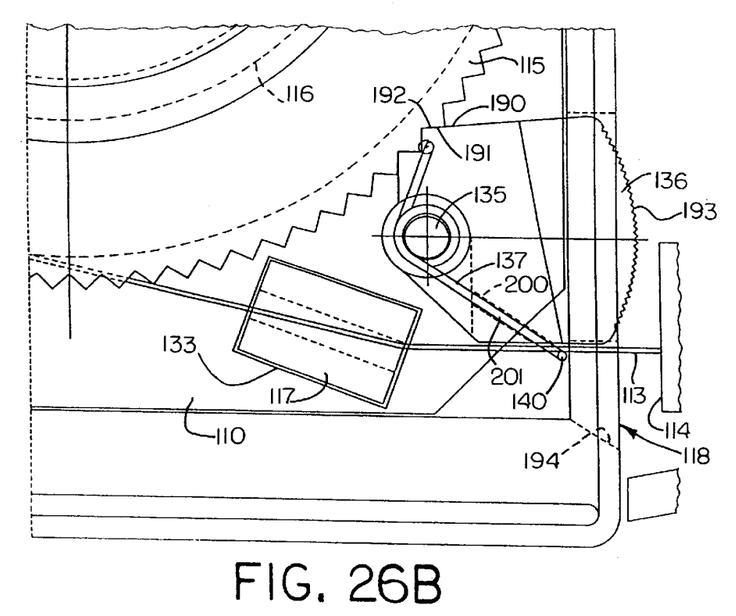

Furthermore, the pawl can be rotated clockwise to unmesh the teeth 191, 192 thereby unlocking or freeing the spool 115 for relatively free rotation in a counterclockwise rotation relative to the illustration of FIG. 26 permitting the cord 113 to be pulled out from the cover or housing 104 of the PCMCIA card. Such clockwise rotation can be achieved by pulling the cord out from the opening 118 in a direction that moves the cord relatively close to the opening wall 194 causing the cord to engage a hook 140 of the pawl spring 137 to rotate the pawl spring and the pawl counterclockwise about the pivot pin 135. Alternatively or additionally, the pawl can be moved manually to rotate it clockwise to unmesh the teeth 191, 192 thereby to unlock the spool 115.

The pawl body 190 has a channel or slot 200 in the bottom surface thereof to receive an arm 201 of the pawl spring. The hook 140 of the pawl spring is at an end of the arm 201. The hook 140 includes a bend 202 which extends below the level of the circuit board 110 and fits in and moves within the area of the triangular cut out 139. The bend 202 and the upstanding leg 203 of the hook 140 are sufficiently large in height direction to tend to assure that the cord will not come out of position as not to engage the leg 203 if pulled along the wall 194 as was mentioned above. Since the cord comes out approximately at the level of the surface of the circuit board 110, it is necessary that the bend extend below the surface of the circuit board, otherwise, too, there would be unnecessary rubbing of the cord against the pawl spring causing wear of the cord and/or pawl spring and/or tending to cause binding of parts against each other.

Figures 27, 28, 29, 30, 31, 32, 33:
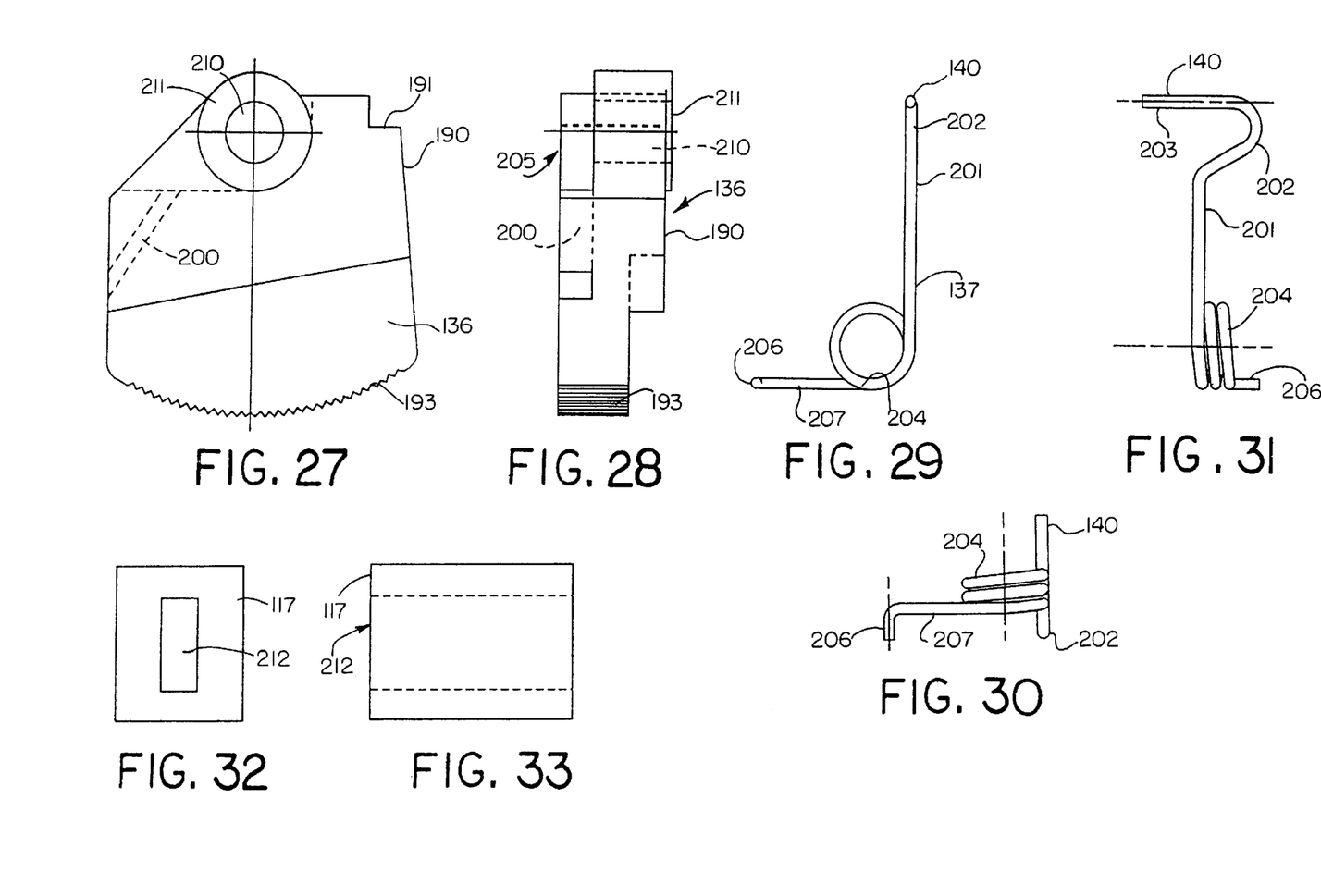
FIGS. 27 and 28 are, respectively, top plan and side elevation views of the pawl.
FIGS. 29–31 respectively, top plan, end elevation, and side views of the pawl spring.
FIGS. 32 and 33 are end and plan views of a ferrite bead.

The pawl spring 137 includes a plurality of spring coils 204 which fit in the pawl body 190 at recess 205. The pawl spring 137 also includes a tab 206 at the end of an arm 207. The tab 206 fits into the opening 138 in the circuit board 110 to anchor the pawl spring thereto.

An axial opening 210 through the pawl receives the pivot pin 135, which may be the same as the pivot pin 131. A thrust bearing surface 211 at the top of the pawl body 190 can abut the inside of the top cover of the PCMCIA card.

Briefly looking at FIGS. 32 and 33, the ferrite bead 117 is shown. The ferrite bead is hollow and the cord 113 may pass through the hollow interior passage 212. The ferrite bead is provided, if necessary, for the usual filtering, noise isolation, etc. purposes. The ferrite bead may be in plural sections which clamp around the cord so that the cord does not have to be threaded through the passage 212. The ferrite bead may be retained in position on the circuit board by the opening 133 and also by the top and bottom covers 104 of the PCMCIA card.

Assuming the circuit board 103 contains a modem or a faxmodem and the retractable cord assembly 102 is intended to connect to a telephone connector using the male connector 114, connections are made by the retractable cord assembly between the connector 114 and circuitry on the circuit board 103 via traces 124, 125. More particularly, the cord 113 includes two conductors. One of those conductors is connected via the spring clip 167, power spring 130, terminal pad 126, trace 122, and a connector pin 121 to trace 125 on the circuit board 103. The other conductor is connected via the wiper terminal 161, pivot pin 131, terminal pad 127, trace 123, and a connector pin 121 to the trace 124 on the circuit board 103.

The cord may be stored within the retractable cord assembly 102 in the PCMCIA card 101 until ready for use. During such storage, the power spring 130 tends to maintain the spool 115 in a clockwise wound direction with the cord 113 stored in the area 157. The pawl 136 is urged in counterclockwise direction by the pawl spring 137 bringing teeth 191, 192 into meshed engagement. As long as the location of that meshed engagement relative to a line drawn between the pivot axes (or rotation axes) of the spool and pawl, respectively, is on the "upstream" side of the spool relative to the direction toward which the spool is being rotated by the power spring 130, such meshed engagement will tend to be a reinforcing locking engagement whereby the teeth 191 and 192 will lock into engagement with each other. Thus, the pawl spring 137 and the torsion spring or power spring 130 will tend to force the pawl 136 and the spool 115 into opposed rotational direction relative to each other to achieve such locking.

To withdraw the cord 113 out from the housing 104, the cord can be pulled. If the cord is pulled out and to the left as viewing FIG. 10 from the back end 106 of the housing 104, the cord will engage the pawl spring hook 140 and will pull the pawl out of engagement with the wall spool thereby freeing the spool to rotate substantially only against the force of the power spring 130 and whatever friction there may be. Alternatively, the pawl can be manually rotated clockwise to unlock the spool. Furthermore, if the pawl does not unlock from the spool 115, due to the relative positioning of the teeth 191, 192 and the rotating of the spool 115 in the counterclockwise direction as the cord 1 13 is pulled, the teeth 191 will ride along the teeth 192 with a "clicking" action. Although this may be less desirable than smooth operation with the pawl fully unlocked as described above, nevertheless the cord still can be pulled from the housing.

To permit the torsion power spring 130 to pull the cord back into the housing 104, the pawl is rotated clockwise either by pulling against the hook 140 by the cord as the cord is allowed to be pulled back into the housing, or by manual application of force directly to the pawl, e.g., to the serrated edge 193.

It is noted herein that where an part is referred to as electrically conductive, it is to be understood that the part may be made entirely of conductive material or, equivalently, the part may be made of partly conductive material or of nonconductive material which is coated with or otherwise provided with electrically conducting characteristics. The several springs may be of metal and where so described are electrically conductive. The spool 115 and pawl 136 preferably are of plastic, such as high strength or engineering plastic material and preferably are not electrically conductive. The circuit board 110 may be of plastic or other suitable material, and the circuit board 103 may be of conventional material as is the usual case in a PCMCIA card.

It will be appreciated that although the invention is described above with respect to a retractable cord mechanism in a miniature circuit card, such as PCMCIA card, the retractable cord mechanism can be used in many other applications. For example, the retractable cord mechanism may be used in another electrical or electronic device, such as a computer, modem (whether on a circuit card inside a computer or a free standing modem), control equipment, network equipment, computers (whether on a circuit card of the computer or elsewhere built into the computer), and so on.

STATEMENT OF INDUSTRIAL APPLICATION

It will be appreciated that the present invention provides for interconnection between a computer and/or circuitry directly associated therewith to another device, such as to a telephone system, further computer, other electronic system, etc. without requiring a separate electrical cable, such as the telephone connector cable.

The embodiments of the invention in which an exclusive property or privilege is claimed are defined in the following claims:

1. A PCMCIA circuit card, comprising:
    a PCMCIA card housing, said housing including a pair of generally planar parallel walls; and
    a support for electronic components and a retractable cord mechanism mounted with respect to said support within said housing;
    said retractable cord mechanism comprising an electrical cable having one end electrically connected to said electronic components and another end which can be selectively withdrawn from said housing
    said housing having an aperture at one end from which said electrical cable may be withdrawn to expose a relatively long length of said cable, and a connector on said another end of said electrical cable for attaching the cable to another connector,
    said retractable cord mechanism also including a storage reel mounted in said housing in generally coplanar relation to said housing between respective generally planar walls of said housing, means for mounting said storage reel for rotation in said housing for withdrawing electrical cable from said storage reel for drawing electrical cable back onto said storage reel to retract the electrical cable retracted back into said housing, and
    said retractable cord mechanism comprising a spring biased storage reel for taking up said cable within said housing as said cable is retracted back into said housing, and further comprising a selectively operable lock means for locking and unlocking rotation of said storage reel.

2. The PCMCIA circuit card of claim 1, wherein the electrical components include a modem.

3. The PCMCIA circuit card of claim 1, wherein the electrical components include a fax/modem.

4. The PCMCIA circuit card of claim 1, wherein the electrical components include a network interface circuit.

5. The PCMCIA circuit card of claim 4, wherein the network interface circuit comprises an Ethernet interface.

6. The PCMCIA circuit card of claim 4, wherein the network interface circuit comprises a Token Ring interface.

7. A PCMCIA circuit card, comprising:
    a PCMCIA card housing, said housing including a pair of generally planar parallel walls; and
    a support for electronic components and a retractable cord mechanism mounted with respect to said support within said housing;
    said retractable cord mechanism comprising an electrical cable having one end electrically connected to said electronic components and another end which can be selectively withdrawn from said housing
    said housing having an opening at one end from which said electrical cable may be withdrawn to expose a relatively long length of said cable, and a connector on said another end of said electrical cable for attaching the cable to another connector,
    said retractable cord mechanism also including a storage reel mounted in said housing, means for mounting said storage reel for rotation in said housing for withdrawing electrical cable from said storage reel for drawing electrical cable back onto said storage reel to retract the electrical cable retracted back into said housing.

* * * * *